United States Patent [19]

Pfeifer

[11] Patent Number: 4,538,078
[45] Date of Patent: Aug. 27, 1985

[54] BASE DRIVE CIRCUIT CONTROLLER

[75] Inventor: George F. Pfeifer, Liverpool, N.Y.

[73] Assignee: General Electric Company, Schenectady, N.Y.

[21] Appl. No.: 481,696

[22] Filed: Apr. 4, 1983

[51] Int. Cl.³ .................. H03K 17/16; H03K 17/296
[52] U.S. Cl. .................................. 307/592; 307/254; 307/601
[58] Field of Search ............... 307/253, 254, 269, 270, 307/228, 592, 601; 363/98, 132

[56] References Cited

U.S. PATENT DOCUMENTS 4,126,819  11/1978  Stobbe et al. .................. 363/132

Primary Examiner—John Zazworsky
Attorney, Agent, or Firm—Mark L. Mollon; James C. Davis, Jr.; Marvin Snyder

[57] ABSTRACT

A base drive circuit controller responsive to an external control signal indicative of the desired conduction of the upper or lower switching device of an inverter leg, provides control signals dependent on timing performed by a psuedo random counter. The external control signal can influence the controller operation only after a complete set of signals responsive to a preceeding transition of the external control signal has been completed. The base drive circuit controller is also responsive to feedback signals indicative of actual switching device conduction, and control signals responsive to the signals indicative of actual power switch conduction are provided to the base drive circuits.

3 Claims, 6 Drawing Figures

FIG. 3

| STATE | SHIFT REGISTERS | |
|---|---|---|
| | A B C D E | |
| 0 | 0 0 0 0 0 | |
| 1 | 1 0 0 0 0 | |
| 2 | 0 1 0 0 0 | |
| 3 | 0 0 1 0 0 | |
| 4 | 1 0 0 1 0 | |
| 5 | 0 1 0 0 1 | |
| 6 | 1 0 1 0 0 | |
| 7 | 1 1 0 1 0 | |
| 8 | 0 1 1 0 1 | |
| 9 | 0 0 1 1 0 | |
| 10 | 1 0 0 1 1 | |
| 11 | 1 1 0 0 1 | |
| 12 | 1 1 1 0 0 | |
| 13 | 1 1 1 1 0 | |
| 14 | 1 1 1 1 1 | |
| 15 | 0 1 1 1 1 | |
| 16 | 0 0 1 1 1 | Decode for 10 μs |
| 17 | 0 0 0 1 1 | |
| 18 | 1 0 0 0 1 | |
| 19 | 1 1 0 0 0 | |
| 20 | 0 1 1 0 0 | |
| 21 | 1 0 1 1 0 | |
| 22 | 1 1 0 1 1 | |
| 23 | 1 1 1 0 1 | |
| 24 | 0 1 1 1 0 | Decode for 15.33 μs |
| 25 | 1 0 1 1 1 | |
| 26 | 0 1 0 1 1 | |
| 27 | 1 0 1 0 1 | |
| 23 | 0 1 0 1 0 | |
| 29 | 0 0 1 0 1 | |
| 30 | 0 0 0 1 0 | |
| 31 | 0 0 0 0 1 | Decode for 20 μs |

BASE DRIVE CIRCUIT CONTROLLER

This invention is related to copending application Ser. No. (481,695), filed on even date herewith and assigned to the same assignee as the present invention.

This invention relates to base drive circuit controllers and more particularly to base drive circuit controllers which generate control signal waveforms for a base drive circuit responsive to a modulation scheme command signal indicative of the upper or lower power switch conduction in a power inverter leg.

BACKGROUND OF THE INVENTION

When base drive circuits such as the one described in copending application Ser. No. (481,695) are used, base drive circuit controllers are needed to provide the appropriate control waveforms.

A problem that occurs in providing properly timed waveform signals to base drive circuits for two series-connected power switching devices, is that the high currents being switched by the power switching devices, generate voltage transients which can couple to the base drive circuit controller circuit and be misinterpreted as signals from the system controller. The system controller generates signals indicative of the desired conduction of the upper or lower power switching device based on a predetermined modulation scheme.

Another drawback of conventional base drive circuit controllers is that they employ analog timing circuits which frequently require adjustment and require components which are adjustable.

Accordingly, it is an object of the present invention to provide a base drive circuit controller that is immune to false triggering during waveform timing sequences.

It is a further object of the present invention to provide a base drive circuit controller which does not use analog timing circuits.

It is a still further object to provide a digital base drive controller that can be integrated on a single chip.

SUMMARY OF THE INVENTION

In one aspect of the present invention, a base drive circuit controller for two base drive circuits is provided. Each base drive circuit is associated with a separate one, respectively, of a pair of series-connected power switches, respectively. The base drive circuit controller is responsive to an external command signal indicative of the desired conduction states of the upper and lower switches. A multistage shift register responsive to the external command signals functions as a pseudo random counter. The multistage shift register has a stable waiting state and a predetermined number of sequentially generated states which end in the stable waiting state. The multistage shift register generates the sequential states when the received external signal transitions from indicating one switch to indicating the other. Decode means responsive to predetermined ones of the sequentially generated states provide signals at predetermined times after the external command signal transitions. Logic means, responsive to the external signal and to signals from the decode means, generate control signals that begin and end at times corresponding to the predetermined decoded state. The control signals are provided to the base drive circuits, with the external command signal determining which control signals go to each base drive circuit. The external command signal is provided to the multistage shift register only when said multistage shift register is in the stable waiting state.

BRIEF DESCRIPTION OF THE DRAWING

While the specification concludes with claims particularly pointing out and distinctly claiming the present invention, the objects and advantages of the invention can be more readily ascertained from the following description of preferred embodiments when used in conjunction with the accompanying drawing in which:

FIG. 3 is a table listing the 32 states of the five stage shift register of FIG. 2;

DETAILED DESCRIPTION OF THE INVENTION

Figure 1:
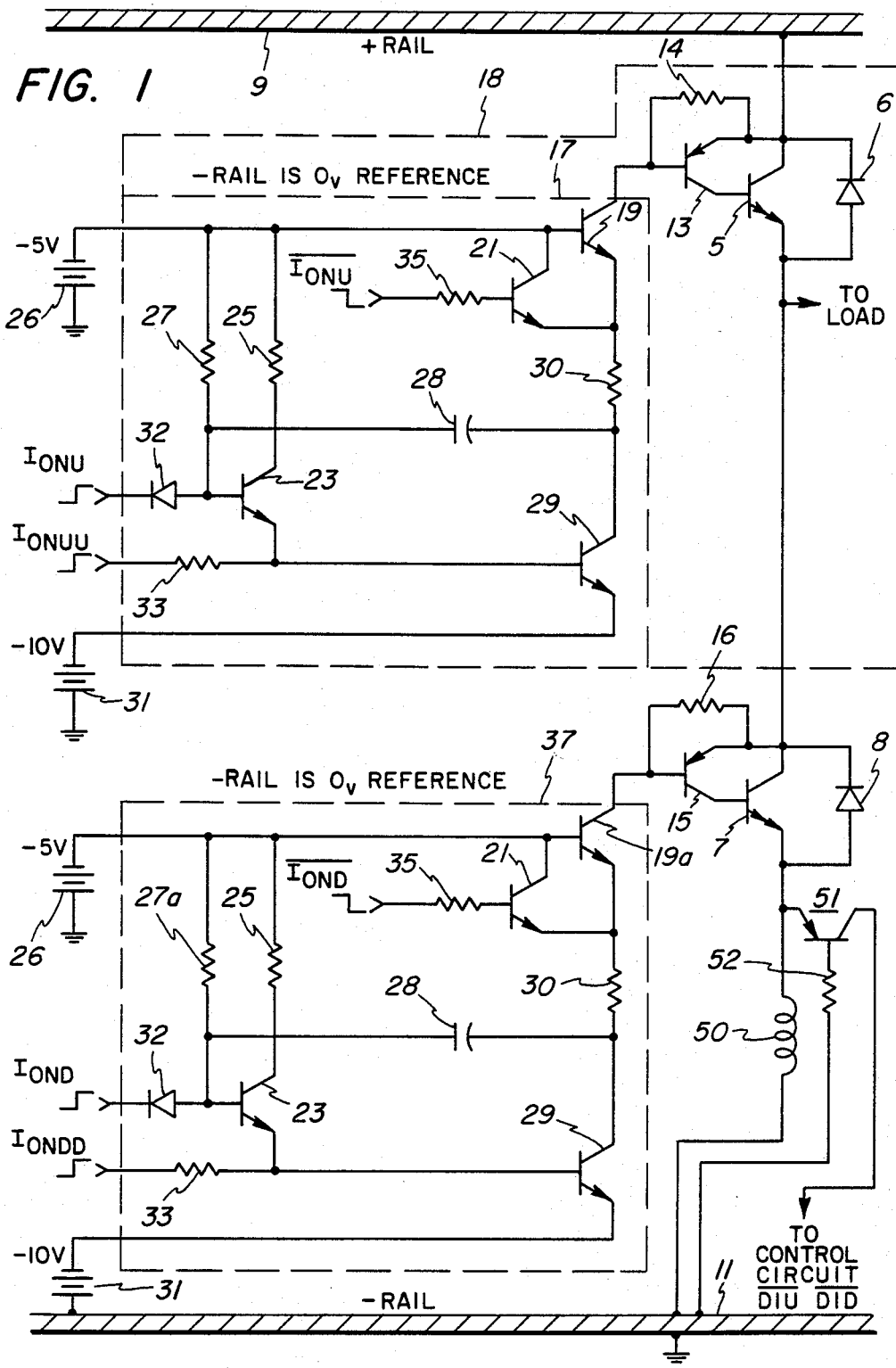
FIG. 1 is a schematic representation of a single leg of an inverter with base drive circuits for each of the two power switches.

Referring now to the drawing wherein like numerals indicate like elements throughout, there are shown in FIG. 1 two NPN power Darlington transistors 5 and 7 connected in series with one another. The series combination of the transistors 5 and 7 is connected between a positive rail 9 and a negative rail 11. The positive and negative rails are connected to a dc power source (not shown). Connected in inverse parallel with transistors 5 and 7 are coasting diodes 6 and 8, respectively. The output of the circuit is taken between the series connected transistors 5 and 7. The two series connected transistors can be part of a chopper or form a single leg of a multiphase inverter.

A PNP driver transistor 13 has its emitter connected to the collector of Darlington transistor 5. A base to emitter bypass resistor 14 is connected between the emitter and base of transistor 13. The emitter of a PNP drive transistor 15 is connected to the collector of Darlington transistor 7 and the collector of transistor 15 is connected to the base of Darlington transistor 7. A base to emitter bypass resistor 16 is connected between the emitter and base of transistor 15. A ramp step generator circuit 17 controls the base current of driver transistor 13 and ramp step generator circuit 17 together with driver transistor 13 comprises the upper base drive circuit 18. Ramp step generator circuit 17 comprises a level shift amplifier including an NPN transistor 19 which is preferably of the high voltage low capacitance type, such as Motorola MJE 13003. NPN transistor 21 serves as a base emitter clamp for transistor 19. The collector and emitter of transistor 21 are connected to the base and emitter, respectively, of transistor 19.

An NPN transistor 23 serves as a ramp step amplifier. The collector of transistor 23 is connected through a biasing resistor 25 to a first power supply 26 and to the base of transistor 19. An NPN transistor 29 serves as a step ramp amplifier. The collector of transistor 29 is coupled through a resistor 30 to the emitter of transistor 19. A capacitor 28 couples the collector of transistor 29 to the base of transistor 23. A charging resistor 27 for capacitor 28 is connected between power supply 26 and the base of transistor 23. The emitter of transistor 23 is connected to the base of transistor 29 and the emitter of transistor 29 is connected to a second power supply 31. The voltage of the first power supply 26 is less negative than the voltage of the second power supply 31. The first power supply 26 can be, for example, −5 volts measured with reference to the negative rail and the second power supply 31 can be −10 volts measured with reference to the negative rail.

A control signal $I_{ONU}$ (the U in the subscript refers to the upper Darlington transistor) is supplied to ramp step generator circuit 17 through a diode 32 to the base of transistor 23. The anode of diode 32 is connected to the base of transistor 23. A control signal $\overline{I_{ONU}}$ (the bar indicates that the signal is the complement of the signal without the bar) is supplied through a coupling resistor 35 to the base of transistor 21. With the first and second power supplies at −5 and −10 volts respectively, the control signals when high (or logical "1") are at a voltage level of −5 and when low (or logical "0") the signals are −10 volts. A control signal $I_{ONUU}$ is supplied through a resistor 33 to the base of transistor 29.

A lower base drive circuit comprises a step ramp generator circuit 37 and driver transistor 15. The step ramp circuit 37 is the same as the step ramp circuit 17 except that the level shift amplifier 19a does not have to be a high voltage NPN type transistor but can have a lower voltage handling ability. The charging resistor 27a is typically larger (94K, for example) than resistor 27 (33K, for example) in the upper base drive circuit, to cause a less steep ramp to be generated in the lower base drive circuit. The control signals for the lower base drive circuit are $I_{OND}$ (the D in the subscript refers to the lower or down Darlington transistor) which is supplied to diode 32 of circuit 37, $I_{ONDD}$ which is supplied to resistor 33 of circuit 37 and $\overline{I_{OND}}$ which is supplied to resistor 35 of circuit 37.

Figure 2:
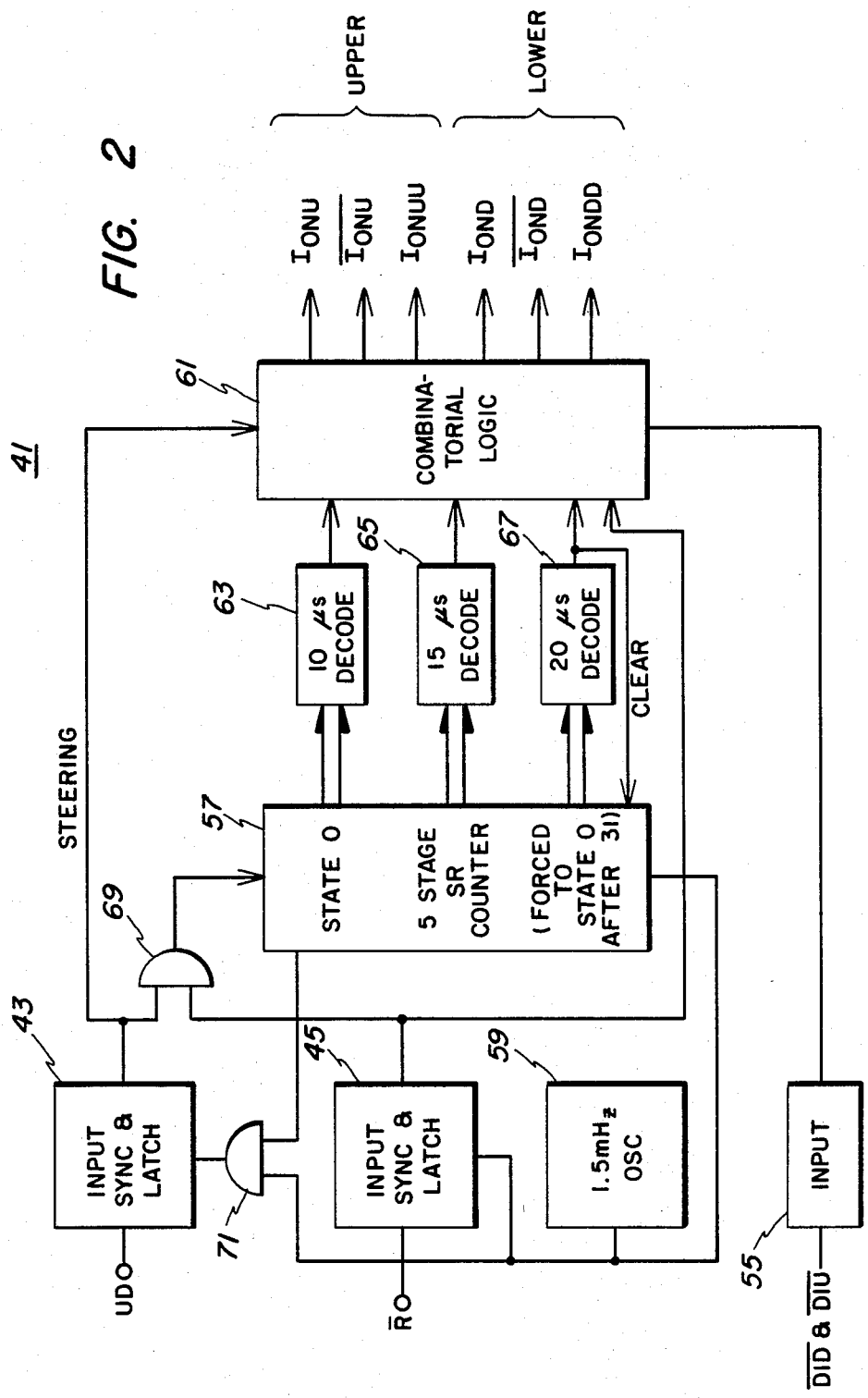
FIG. 2 is a block diagram representation of a logic circuit for generating control signals to the base drive circuits of FIG. 1 in accordance with the present invention.

Referring now to FIG. 2, a control signal generator logic circuit 41 is shown which provides three control signals $I_{ONU}$, $\overline{I_{ONU}}$, and $I_{ONUU}$ for the upper base drive and three control signals $I_{OND}$, $\overline{I_{OND}}$, and $I_{ONDD}$ for the lower base drive of FIG. 1. The control circuit 41 is responsive to a set of input command signals:

Up/Down (UD)
Reset ($\overline{R}$)
Rate of change of current control signal ($\overline{DIU}$ and $\overline{DID}$)

The UD signal is supplied to an input synchronization and latch 43. The reset signal is connected to an input synchronization and latch 45. The $\overline{DIU}$ and $\overline{DID}$ signal is provided by a small inductance 50 shown in FIG. 1 (which can be one or more turns of the emitter lead of Darlington 7) through an amplifier switch shown as a PNP transistor 51. The emitter of transistor 51 is connected between inductor 50 and the emitter of Darlington 7. The base of transistor 51 is connected through a current limiting resistor 52 to the negative rail 11. The collector of transistor 51 supplies the $\overline{DID}$ and $\overline{DIU}$ signal to an input circuit 55, shown in FIG. 2, which comprises a Schmitt trigger to prevent noise from entering the logic circuitry. The output of the input circuit 55 is connected to combinatorial logic circuit 61.

The output of input synchronization and latch circuit 43 is connected to combinatorial logic circuit 61 and to an input of a two input AND gate 69. The output of input synchronization and latch circuit 45 is connected to the other input of AND gate 69 and also to combinatorial logic circuit 61. The output of AND gate 69 is connected to the input of shift register 57 which can be five interconnected D flip-flops. Separate outputs of the five stage shift register are connected to 10 microsecond decode circuit 63, a 15 microsecond decode circuit 65, and a 20 microsecond decode circuit 67. The output of each of the decode circuits is connected to logic circuit 61. An oscillator circuit 59 provides clock signals to the five stage shift register 57, input synchronization and latch circuit 45 and one input of a two input AND gate 71. The other input of AND gate 71 is provided by a signal from shift register 57 indicative of the shift register being in state 0. The output of AND gate 71 is connected to provide clock signals to input synchronization circuit 43 when shift register 57 is in the 0 state.

The operation of the control signal generator circuit or logic circuit 41 will now be described assuming that $\overline{R}$ is high and hence (R is low). The five stage shift register 57 performs a timing function together with the RC oscillator 59, by stepping through 32 states with state 0 being the initial state. The 32 states sequentially achieved are indicated in FIG. 3. The RC oscillator 59 supplies, for example, a 1.5 MHz signal as the clock signal for logic circuit 41. Initially the shift register is in the 0 state which is a stable waiting state. The 0 state permits clock pulses to reach the input synch and latch 43 through AND gate 71. AND gate 69 is enabled since $\overline{R}$ is high. A transistion of the UD signal sets the first shift register stage and the clock signal to circuit 43 is thereby inhibited in AND gate 71 so that any subsequent UD transistions (due to noise from the Darlington switching transistors or other sources) will not have any effect on the shift register until the shift register is again in the 0 state. The inhibiting of UD signals except when the shift register is in the 0 state also prevents the power switches 5 and 7 (FIG. 1) from being inadvertently driven at too high a switching frequency which could cause excessive switching losses. The shift register proceeds sequentially from state 1 to 31 driven by the clock signal. When the shift register reaches state 31, state 31 is decoded through decoding circuitry 67 and the shift register is forced back to the stable waiting 0 state by a CLEAR signal therefrom.

As the shift register proceeds sequentially through the states 1 through 31, states 16, 24 and 31 are decoded through decoders 63, 65 and 67, respectively, to generate 10, 15 and 20 microsecond timing signals respectively. The timing signals are combined in combinatorial logic circuit 61 to generate the waveforms shown in FIG. 4. The UD signal is used to steer the output waveforms to the appropriate base drive (shown in FIG. 1). In addition to the waveforms shown in FIG. 4, the complements of signals $I_{ONU}$ and $I_{OND}$ are generated. Thus at each transition of the UD signal the shift register will generate a full set of timing waveforms.

Figure 4:
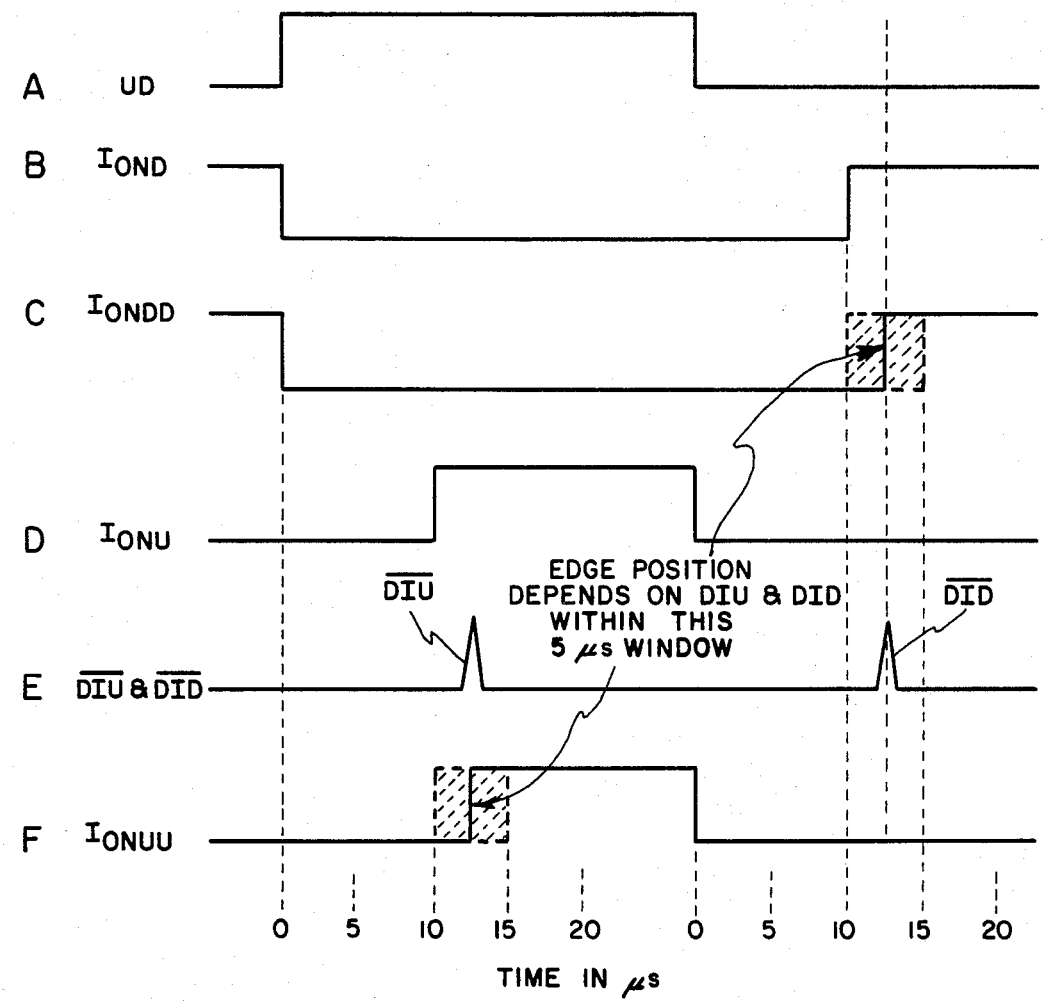
FIG. 4 shows typical waveform diagrams on a common time scale provided to and generated by the logic circuit of FIG. 2.

Referring now to FIG. 4, typical waveforms provided by the control signal generator circuit 41 of FIG. 2 are shown. The waveforms are shown for the condition when the reset signal $\overline{R}$ is high. FIG. 4A shows the UD signal provided to the control signal generator circuit 41. At time 0 indicated by the time scale along the bottom of the figure, the UD signal transitions from low to high amplitude, indicative of a command from an external modulation scheme for the upper Darlington in the circuit of FIG. 1 to be conductive. FIG. 4B shows the signal $I_{OND}$, which goes low when UD goes high, and FIG. 4C shows the signal $I_{ONDD}$ which also goes low when UD goes high, causing the lower Darlington in the circuit of FIG. 1 to be biased out of conduction in the manner subsequently explained. FIG. 4D shows signal $I_{ONU}$ going high following a 10 microsecond delay after the transition of the UD signal. The 10 microsecond delay is the lockout time to assure no time overlap in conduction between the upper and lower Darlington in the circuit of FIG. 1. FIG. 4E shows the $\overline{DIU}$ signal and the $\overline{DID}$ signal. The $\overline{DIU}$ signal is shown occurring first, followed by the $\overline{DID}$ signal. The $I_{ONUU}$ signal, shown in FIG. 4F, is seen to transition on the occurrence of the $\overline{DIU}$ signal. The combinatorial logic circuit 61 of FIG. 2 is responsive to the $\overline{DIU}$ and $\overline{DID}$ signal only between 10 and 15 microseconds after the UD transition. If the $\overline{DIU}$ signal is not received from Schmitt trigger circuit 55 of FIG. 2 in the 5 microsecond window, the $I_{ONUU}$ signal occurs 15 microseconds after the UD transition. The 5 microsecond window eliminates responses to spurious signals due to inductive and capacitive interwiring coupling.

A similar chain of events occurs when the UD signal transitions from a high to low state. Signals $I_{ONU}$ and $I_{ONUU}$, shown in FIGS. 4D and 4F, respectively, go low at the UD signal transition. The complement of $I_{ONU}$, the waveform of which is not shown, is also generated to clamp the upper Darlington 5 in the circuit of FIG. 1. After a 10 microsecond lockout signal $I_{OND}$, shown in FIG. 4B, goes high. On the occurrence of the $\overline{DID}$ pulse shown in FIG. 4E, signal $I_{ONDD}$ shown in FIG. 4C goes high.

Figure 5:
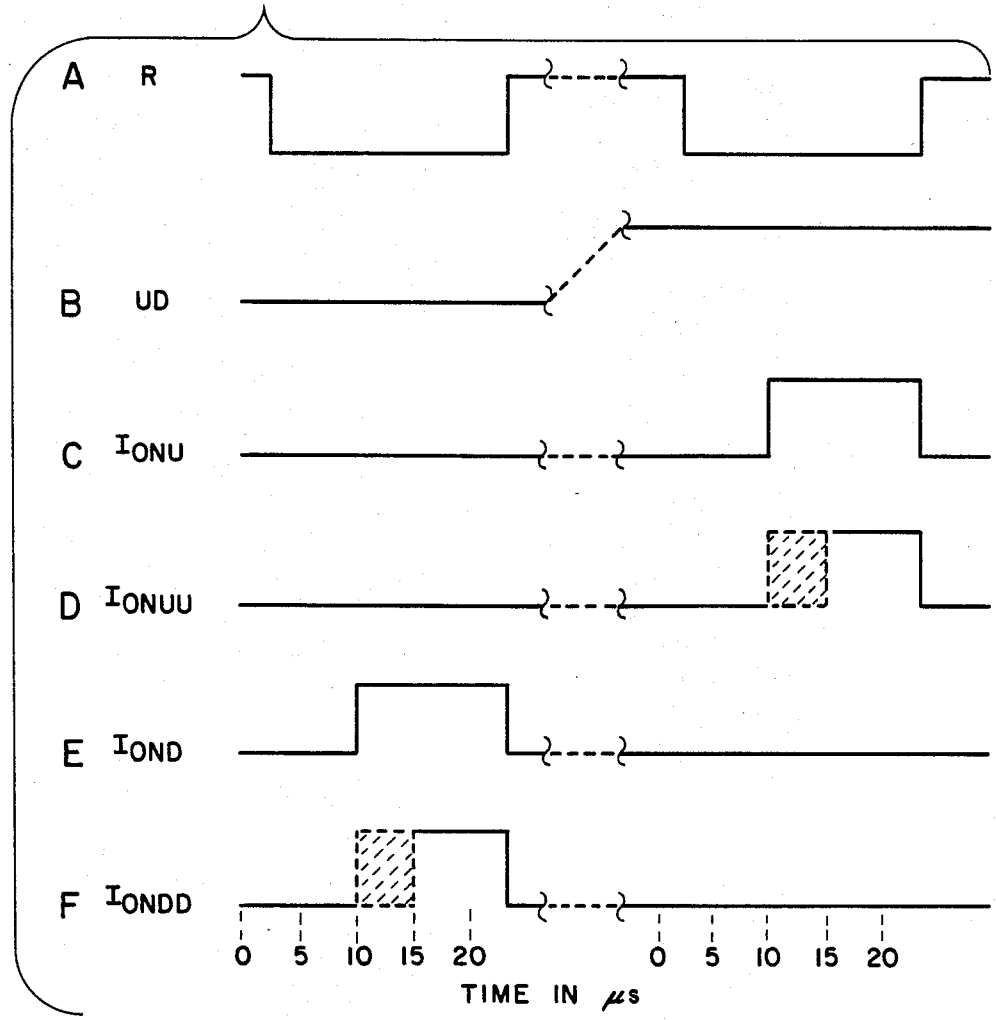
FIG. 5 shows waveform diagrams on a common time scale illustrating the reset operation of the logic block diagram of FIG. 2.

Referring now to FIG. 5, the operation of the reset command $\overline{R}$ is shown. $\overline{R}$ high results in normal operation of the logic circuit 41 of FIG. 2. When $\overline{R}$ transitions low, signals $I_{ONU}$, $I_{OND}$, $I_{ONUU}$, $I_{ONDD}$ go low, with signals $\overline{I_{ONU}}$ and $\overline{I_{OND}}$ clamping the upper and lower Darlington transistors in the circuit of FIG. 1, in the manner described below.

Operation of the base drive circuit of FIG. 1 is as follows. Assuming initially the upper Darlington transistor 5 is not conducting, signals $I_{OND}$ and $I_{ONDD}$ are high, resulting in the lower Darlington transistor 7 conducting. The UD signal goes high and the lower Darlington transistor 7 is clamped off by a signal $\overline{I_{OND}}$ causing lower transistor 21 to conduct, clamping the base emitter junction of transistor 19a which, in turn, turns off the lower Darlington transistor 7 by removing base current therefrom. Resistor 16 provides a path for base current in transistor 15 during turn-off. In high voltage, high power circuits it may be necessary to provide a high speed clamp circuit (not shown) for transistor 15 for appropriate turn-off. At the transition of command UD, signals $I_{OND}$ and $I_{ONDD}$ go low. After a 10 micro-second delay which serves as a guard band to insure there is no overlap in conduction of the upper and lower Darlington transistors 5 and 7, respectively, $I_{ONU}$ goes high, resulting in transistor 23 being biased into active conduction. Current flows through resistor 27 to capacitor 28 and to the base of transistor 23.

Resistors 25, 27 and 30, transistors 23 and 29 and capacitor 28 function together as the well known Miller integrator generating a rising ramp of current through resistor 30 to transistor 19 turning on transistor 19. Transistor 19 biases the driver 13 for the Darlington transistor 5 into conduction which in turn causes the upper Darlington transistor 5 to conduct. The conduction of Darlington transistor 5 is detected by the rapid decrease of current through diode 8 which biases transistor 51 into conduction, providing a $\overline{DIU}$ signal to the logic circuit 41 of FIG. 2. Signal $I_{ONUU}$ then provides additional base current through resistor 33 to transistor 29, saturating transistor 29. A step of current thus flows through transistor 29, with resistor 30 controlling the magnitude of the step current. When transistor 29 is in saturation, the collector voltage is held to a small constant voltage, preventing the Miller effect from occurring. The controlled turn-on of the Darlington transistor 5 is accompanied by the clearing of the stored charge in the coasting diode 8 in parallel with lower Darlington transistor 7 which is presumed to have been carrying load current during the upper Darlington transistor's nonconduction interval. Excessive overshoot of the upper Darlington transistor collector current is avoided by the choice of the ramp current slope through transistor 19. The upper Darlington transistor is then operated in the quasi-saturation region (which is the border between the active and the saturated region) to minimize losses in the ramp step generator.

The turn on of the lower Darlington transistor 7 is accomplished in a similar manner and is detected by the rapid increase of current through inductor 50.

The value of the resistors 27 and 27a determine the ramp current slope if the other conditions of the parameters (transistors and capacitors) remain unchanged. The effect of the turn on voltage rate of change with respect to time upon the base current drivers 13 and 15 via their stray capacitances is asymmetrical. When the upper Darlington transistor 5 is biased into conduction, the voltage at its emitter and therefore its base, rises, and stray capacitance at the base of the Darlington transistor necessitates that transistor 19 supply current to the base of transistor 13 and to the stray capacitance. If the ramp current from transistor 19 is not sufficient then Darlington transistor 5 may oscillate during turn-on. The stray capacitance at the base of the lower driver 15, however, adds to the base current of the lower driver 15 at turn-on so that a less steep ramp is necessary for appropriate turn-on.

Figure 6:
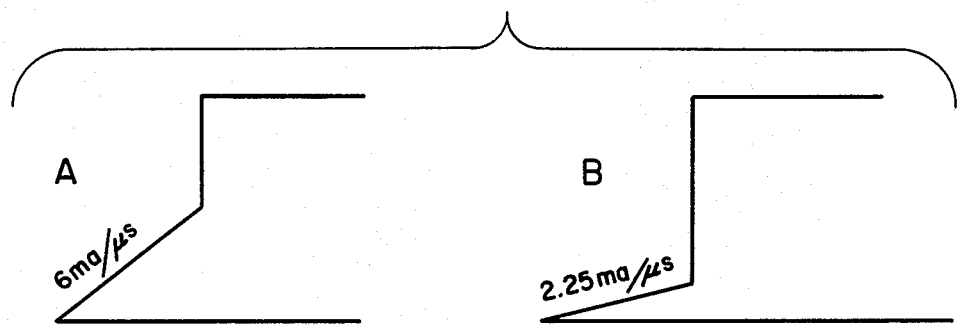
FIG. 6 contains waveform diagrams showing output current of the base drive circuit of FIG. 1.

Referring to FIGS. 6A and 6B the output current waveforms of the upper and lower base drivers 13 and 15, respectively, of FIG. 1 are shown. The different slopes of the ramp portion for the upper and lower base drives can be readily seen. A small current sensing toroidal transformer (not shown) can be used in place of inductor 50 to sense the emitter current of the lower Darlington transistor 7. The turn on of the lower Darlington transistor is sensed by its increasing current flow while the conduction of the upper Darlington transistor is detected by the decreasing current in coasting diode 8 as the inductor 50 swings out of saturation. Alternatively, a small current sensing transformer (not shown) could be used to directly monitor each of the upper and lower Darlington transistor emitter currents, respectively, if desired.

It will be noted that only a single power supply for logic and base drive circuits is needed for any number of inverter legs with the power supply referenced to the negative rail. The level shifting transistor 19 allows the Darlington transistor 5 connected to the upper rail to respond to logic level signals referenced to the lower rail without the use of transformer isolated power supplies.

The base drive controller and its associated UD command signal controls one leg of an inverter. An additional base drive controller with an appropriate UD command signal would be used for each additional inverter leg. Noise resulting from switching currents in the power switches becomes greater in multiple leg inverters and the noise filtering provided in connection with the UD command and $\overline{\text{DIU}}$ and $\overline{\text{DID}}$ feedback signal becomes even more significant.

The foregoing thus describes a peak turn-on current limiting base drive that does not require turn-on or turn-off snubbers, develops power from the dc link and does not require isolating base drive transformers.

While the invention has been particularly shown and described with reference to a preferred embodiment thereof, it will be understood by those skilled in the art that various changes in form and detail may be made without departing from the spirit and scope of the invention.

What is claimed is:

1. A base drive circuit controller for two base drive circuits, each of said base drive circuits connected to an upper and a lower series-connected power switch, respectively, said base drive circuit controller responsive to an external command signal indicative of desired conduction of said upper or lower power switch, said base drive circuit controller comprising:

a multistage shift register responsive to said external command signal so as to function as a pseudo random counter, said multistage shift register having a stable waiting state and a predetermined number of sequentially generated states which end in said stable state, said multistage shift register generating said sequential states when said external command signal transitions from indicating desired conduction of one of said switches to indicating desired conduction of the other of said switches;

decode circuit means responsive to predetermined ones of said sequentially generated states for providing timing signals at predetermined times after said external command signal transitions from one amplitude to another;

logic means responsive to said timing signals and said external command signal, for providing control signals that begin and end at predetermined times corresponding to said predetermined ones of said sequentially generated states, respectively, to said base drive circuits corresponding to the upper and lower power switches dependent on said external command signal; and gating means coupling said external command signal to said multistage shift register only when said multistage shift register is in the stable waiting state.

2. The base drive controller of claim 1 further comprising means coupling said upper and lower series-connected power switches to said logic means for supplying to said logic means a signal indicative of actual conduction of said upper and lower series-connected power switches, said logic means providing control signals to one of said base drive circuits in accordance with said external command signal and said signal indicative of actual conduction.

3. The base drive controller of claim 2 wherein said logic means is responsive to said signal indicative of actual conduction for a predetermined duration occurring a predetermined time after said external command transitions.

* * * * *